United States Patent
Di Sarro et al.

(10) Patent No.: US 8,809,129 B2
(45) Date of Patent: Aug. 19, 2014

(54) DIODE-TRIGGERED SILICON CONTROLLED RECTIFIER WITH AN INTEGRATED DIODE

(71) Applicant: International Business Machines Corporation, Armonk, NY (US)

(72) Inventors: James P. Di Sarro, Essex Junction, VT (US); Robert J. Gauthier, Jr., Hinesburg, VT (US); Junjun Li, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/072,125

(22) Filed: Nov. 5, 2013

(65) Prior Publication Data
US 2014/0057397 A1 Feb. 27, 2014

Related U.S. Application Data

(62) Division of application No. 13/455,653, filed on Apr. 25, 2012, now Pat. No. 8,680,573.

(51) Int. Cl.
*H01L 21/332* (2006.01)
*H01L 21/76* (2006.01)

(52) U.S. Cl.
USPC .......................................... 438/133; 438/424

(58) Field of Classification Search
USPC ................................................. 438/133, 424
See application file for complete search history.

(56) References Cited

U.S. PATENT DOCUMENTS

| | | | |
|---|---|---|---|
| 5,548,135 A | 8/1996 | Avery | |
| 6,074,899 A | 6/2000 | Voldman | |
| 6,323,523 B1 | 11/2001 | Lee et al. | |
| 6,353,237 B1 | 3/2002 | Yu | |
| 6,521,952 B1 | 2/2003 | Ker et al. | |
| 6,768,619 B2 | 7/2004 | Ker et al. | |
| 7,023,029 B1 | 4/2006 | Vashchenko et al. | |
| 7,405,435 B2 | 7/2008 | Sato | |
| 7,777,277 B2 | 8/2010 | Hung | |
| 7,800,128 B2 | 9/2010 | Domanski et al. | |
| 8,089,127 B2 | 1/2012 | Hung | |
| 8,592,860 B2 * | 11/2013 | Salcedo et al. | 257/140 |
| 8,680,573 B2 * | 3/2014 | Di Sarro et al. | 257/146 |
| 2012/0218671 A1 | 8/2012 | Domanski et al. | |

(Continued)

OTHER PUBLICATIONS

Di Sarro, et al., U.S. Appl. No. 13/778,479 entitled Bi-Directional Silicon Controlled Rectifier Structure filed Feb. 27, 2013.

(Continued)

*Primary Examiner* — Ngan Ngo
(74) *Attorney, Agent, or Firm* — Wood, Herron & Evans LLP; Anthony J. Canale (57) ABSTRACT

Device structures, design structures, and fabrication methods for a silicon controlled rectifier. A well of a first conductivity type is formed in a device region, which may be defined from a device layer of a semiconductor-on-insulator substrate. A doped region of a second conductivity type is formed in the well. A cathode of a silicon controlled rectifier and a cathode of a diode are formed in the device region. The silicon controlled rectifier comprises a first portion of the well and an anode comprised of a first portion of the doped region. The diode comprises a second portion of the well and an anode comprised of a second portion of the doped region.

11 Claims, 8 Drawing Sheets

(56) References Cited

U.S. PATENT DOCUMENTS

| | | |
|---|---|---|
| 2013/0256748 A1 | 10/2013 | Clark, Jr. et al. |
| 2013/0256749 A1 | 10/2013 | Clark, Jr. et al. |
| 2013/0258532 A1 | 10/2013 | Clark, Jr. et al. |
| 2013/0277712 A1* | 10/2013 | Domanski et al. ............ 257/173 |
| 2013/0313607 A1* | 11/2013 | Camillo-Castillo et al. .. 257/175 |

OTHER PUBLICATIONS

A. Marichal et al., SCR based ESD protection in nanometer SOI technologies, 2005 Electrical Overstress/Electrostatic Discharge Symposium, Sep. 16, 2005.

A. Salman et al., Double well field effect diode: Lateral SCR-like device for ESD protection of I/Os in deep sub micron SOI, 29th Electrical Overstress/Electrostatic Discharge Symposium, Sep. 21, 2007.

M. Mergens, Advanced SCR ESD protection circuits for CMOS/SOI nanotechnologies, Proceedings of the Custom Integrated Circuits Conference, Sep. 21, 2005.

Gauthier, et al., Investigation of Voltage Overshoots in Diode Triggered Silicon Controlled Rectifiers (DTSCRs) Under Very Fast Transmission Line Pulsing (VFTLP), Overstress/Electrostatic Discharge Symposium Proceedings 2009 09-342 5A.4-9 and 4-10.

USPTO, Notice of Allowance issued in U.S. Appl. No. 13/455,653 dated Oct. 28, 2013.

* cited by examiner

DIODE-TRIGGERED SILICON CONTROLLED RECTIFIER WITH AN INTEGRATED DIODE

BACKGROUND

The present invention relates to semiconductor device fabrication and, more specifically, to device structures and design structures for a silicon controlled rectifier, as well as methods for fabricating a silicon controlled rectifier.

A silicon-controlled rectifier (SCR) is a four-layer solid state device utilized in current control applications. The SCR includes three electrodes or terminals, namely an anode, a cathode, and a gate, that are distributed among the four layers. In its quiescent state, the SCR restricts current conduction to leakage current. However, a signal applied to the gate that causes the gate-to-cathode voltage to exceed an engineered threshold, known as the trigger voltage, can initiate the conduction of a forward current between the anode and cathode. In response to the triggering signal being removed from the gate, the SCR conducts current as long as the conducted current remains above an engineered holding current. When the conducted current drops below the holding current, the SCR returns to its quiescent state.

A chip may be exposed to random electrostatic discharge (ESD) events that can direct potentially large and damaging ESD currents to the integrated circuits of the chip. Precautions may be taken to avoid causing ESD events or to militate against the effect of an ESD event. One such precaution is to incorporate an ESD prevention circuit into the chip. The ESD protection circuit prevents damage to the sensitive devices of the integrated circuits during post-manufacture chip handling and after chip installation on a circuit board or other carrier. If an ESD event occurs, the ESD protection circuit triggers an ESD protection device, such as a silicon-controlled rectifier, to enter a low-impedance, conductive state that directs ESD current to ground and away from the sensitive devices in the integrated circuits on the chip. The ESD protection device clamps the ESD protection device in its conductive state until the ESD current is drained and the ESD voltage is discharged to an acceptable level. In this fashion, the ESD prevention circuit prevent the ESD event from inflicting damage upon the integrated circuits of the chip.

Improved device structures, fabrication methods, and design structures are needed for a silicon controlled rectifier.

SUMMARY

According to one embodiment of the present invention, a method of fabricating a device structure includes forming a well of a first conductivity type in a device region, and forming a doped region of a second conductivity type in the well. A cathode of a silicon controlled rectifier is formed in the device region and a cathode of a diode is formed in the device region. The silicon controlled rectifier comprises a first portion of the well and an anode comprised of a first portion of the doped region. The diode comprises a second portion of the well and an anode comprised of a second portion of the doped region.

According to another embodiment of the present invention, a device structure includes a first well of a first conductivity type in a device region and a first doped region of a second conductivity type in the well. A silicon controlled rectifier and a diode are in the device region. The silicon controlled rectifier includes a cathode, a first portion of the well, and an anode comprised of a first portion of the doped region. The diode includes a cathode, a second portion of the well, and an anode comprised of a second portion of the doped region.

According to another embodiment of the present invention, a design structure is provided that is readable by a machine used in design, manufacture, or simulation of an integrated circuit. The design structure includes a first well of a first conductivity type in a device region and a first doped region of a second conductivity type in the well. A silicon controlled rectifier and a diode are in the device region. The silicon controlled rectifier includes a cathode, a first portion of the well, and an anode comprised of a first portion of the doped region. The diode includes a cathode, a second portion of the well, and an anode comprised of a second portion of the doped region. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
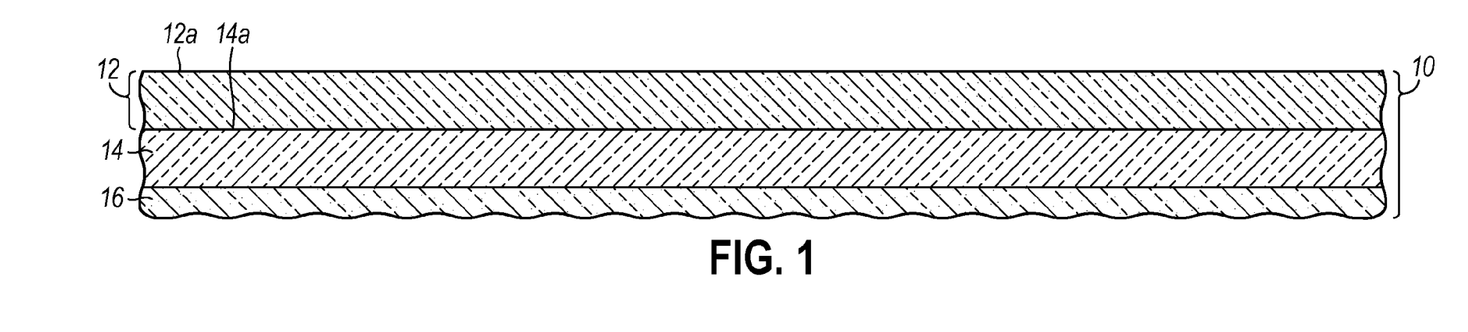
FIG. 1 is a cross-sectional view of a portion of a substrate at an initial fabrication stage of a processing method for forming a device structure in accordance with an embodiment of the invention.

With reference to FIG. 1 and in accordance with an embodiment of the invention, a semiconductor-on-insulator (SOI) substrate 10 includes a device layer 12, a buried insulator layer 14, and a handle wafer 16. The device layer 12 is separated from the handle wafer 16 by the intervening buried insulator layer 14 and is in direct contact along a planar interface with a top surface 14a of the buried insulator layer 14. The buried insulator layer 14 electrically insulates the handle wafer 16 from the device layer 12, which is considerably thinner than the handle wafer 16. The buried insulator layer 14 may be comprised of an electrical insulator and, in particular, may be comprised of silicon dioxide (e.g., $SiO_2$) to constitute a buried oxide layer.

The device layer 12 and handle wafer 16 may be comprised of a monocrystalline semiconductor material, such as single crystal silicon or another crystalline semiconductor material that contains primarily silicon, and the semiconductor material of the device layer 12 may be device quality. The device layer 12 may have a thickness measured from its top surface 12a to a top surface 14a of the buried insulator layer 14 ranging from two (2) nm to 150 nm. The SOI substrate 10 may be fabricated by any suitable conventional technique, such as wafer bonding techniques or separation by implantation of oxygen (SIMOX) techniques, familiar to a person having ordinary skill in the art.

With reference to FIGS. 2, 2A, 2B, 2C in which like reference numerals refer to like features in FIG. 1 and at a subsequent fabrication stage, a plurality of device regions 18, 20 are formed from the device layer 12 and are in proximity to each other. The device regions 18, 20 are circumscribed by trench isolation regions 22, which provide electrical isolation. The device regions 18, 20 have respective top surfaces 18a, 20a that are nominally co-planar with a top surface 22a of the trench isolation regions 22. The respective sizes, geometrical shapes, and outer perimeters of the device regions 18, 20 are defined by the locations and arrangement of the trench isolation regions 22.

Device region 18 has a non-rectangular geometrical shape with a larger section 24, a smaller section 25, and a section 21 that joins section 24 with section 25. Section 25 of device region 18 is positioned proximate to device region 20 so that their nearest-neighbor edges are separated by one of the trench isolation regions 22. Section 24 has a width, $W_1$, section 25 has a width, $W_2$, that is smaller than the width, $W_1$, of section 24, and section 21 has a width, $W_3$, that is smaller than width, $W_1$, or width, $W_2$. Section 24 has an individual length, $L_1$, section 25 has an individual length, $L_2$, and section 21 has an individual length, $L_3$, so that the device region 18 has a total length given by the sum of the individual lengths. Device region 20 may have a width approximately equal to the width, $w_2$, of section 25 of device region 18.

Figure 2:
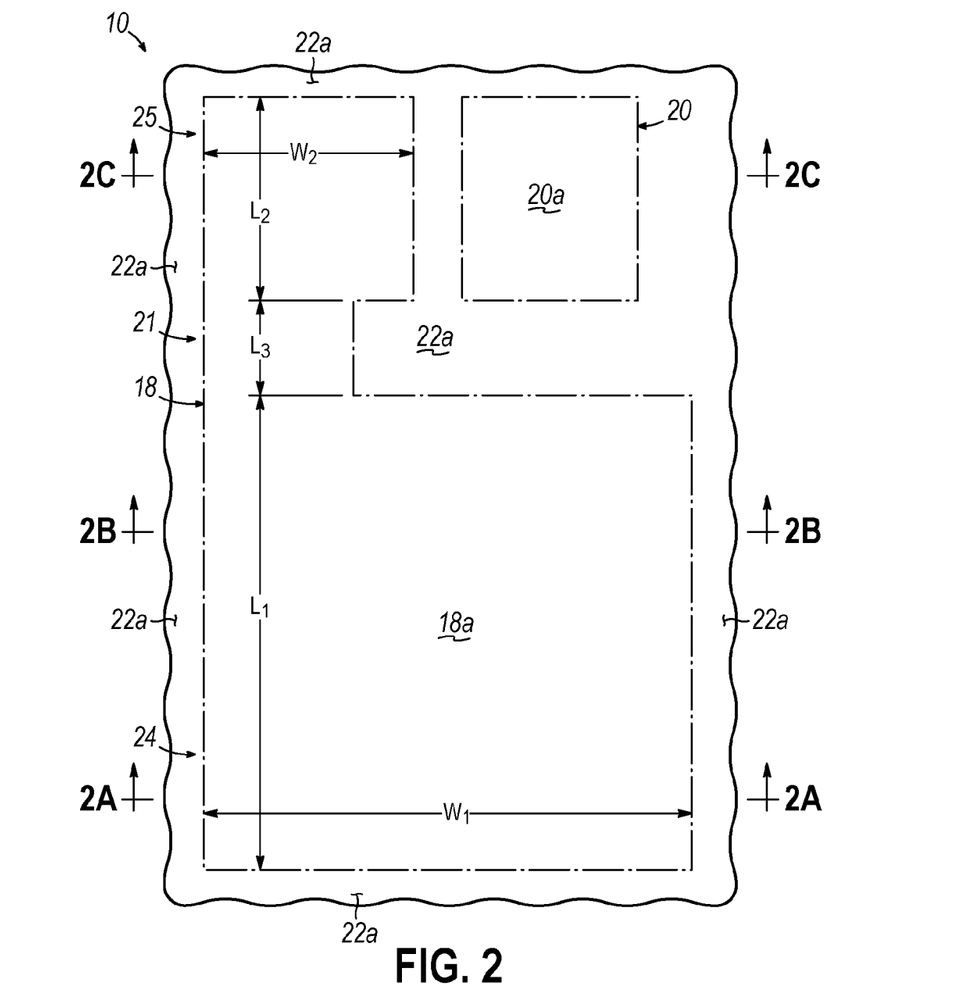
FIG. 2 is a top view of the substrate portion of a substrate at a fabrication stage of the device structure subsequent to FIG. 1.
Figure 2A:
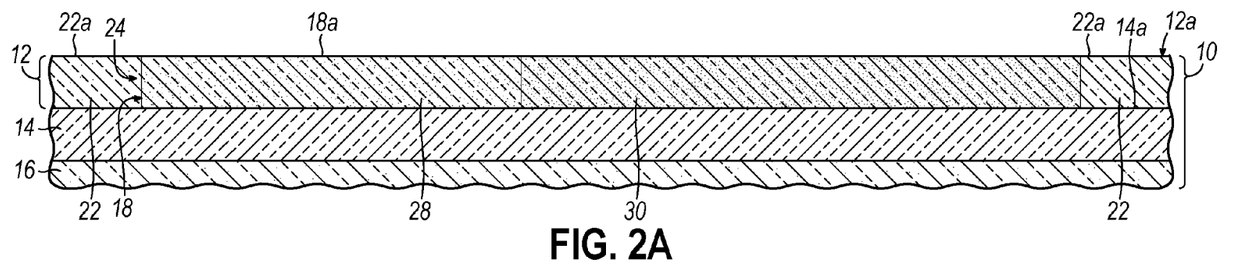
FIG. 2A is a cross-sectional view taken generally along line 2A-2A in FIG. 2.
Figure 2B:
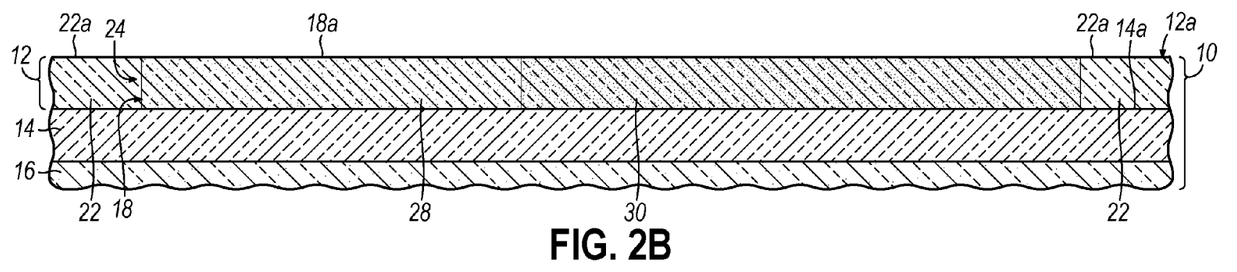
FIG. 2B is a cross-sectional view taken generally along line 2B-2B in FIG. 2.
Figure 2C:
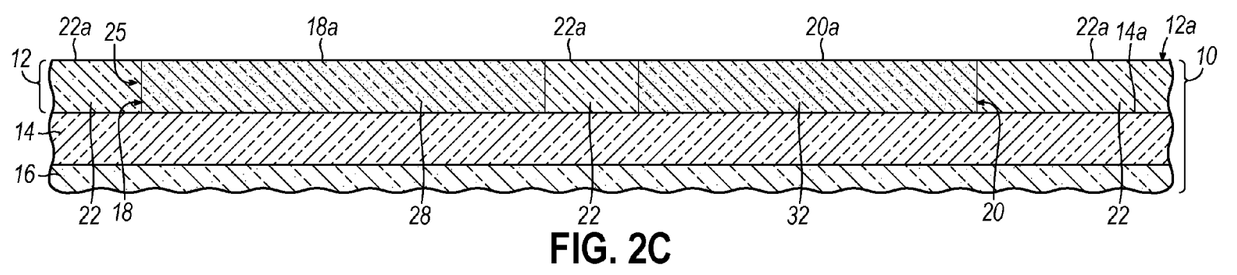
FIG. 2C is a cross-sectional view taken generally along line 2C-2C in FIG. 2.

The trench isolation regions 22 may be isolation structures formed by a shallow trench isolation (STI) technique that relies on lithography and dry etching processes to define trenches that reach in depth to the top surface 14a of the buried insulator layer 14, deposits an electrical insulator to fill the trenches, and planarizes the electrical insulator relative to the top surface 12a of the device layer 12 (FIG. 1) using, for example, a chemical mechanical polishing (CMP) process. The trench isolation regions 22 may be comprised of a dielectric material, such as an oxide of silicon and, in particular, densified tetraethylorthosilicate (TEOS) deposited by chemical vapor deposition (CVD).

Wells 28, 30, 32 may be formed as doped regions in the device regions 18, 20 that are comprised of semiconductor material from the device layer 12 with opposite conductivity types. In the representative embodiment, the wells 28, 30 are juxtaposed with each other and are localized in the device region 18, and well 32 is localized in device region 20. The wells 28, 30 are comprised of lightly-doped semiconductor material of opposite conductivity types. The well 32 is also comprised of lightly-doped semiconductor material and, in the representative embodiment, has the same conductivity type as well 28.

Wells 28, 32 may be formed by implanting ions of an impurity species into the device regions 18, 20 in the presence of a patterned mask applied to the top surface of the device layer 12. Well 30 may be formed by implanting ions of an impurity species into the device regions 18, 20 in the presence of a different patterned mask applied to the top surface of the device layer 12. Each mask controls dopant introduction into device regions 18, 20 during implantation by stopping the implanted ions within its thickness so that the device layer 12 is selectively implanted with the impurity species to respectively form the wells 28, 30, 32. Each mask may be a photoresist layer having a window aligned with the intended location of one of the wells 28, 30, 32 and formed in the mask using a photolithographic patterning process. The implantation conditions (e.g., kinetic energy and dose) are selected to form each of the wells 28, 30, 32 with a desired doping concentration (e.g., light doping). After ion implantation is complete, each mask is removed by, for example, oxygen plasma ashing or wet chemical stripping.

In a representative embodiment, the wells 28, 32 may each be lightly-doped n-wells with the constituent semiconductor material having an n-type conductivity supplied by implanting ions of an impurity species from Group V of the Periodic Table (e.g., phosphorus (P), arsenic (As), or antimony (Sb)) and the well 30 may be a lightly-doped p-well with the constituent semiconductor material having a p-type conductivity supplied by implanting ions of an impurity species from Group III of the Periodic Table (e.g., boron (B), aluminum (Al), gallium (Ga), or indium (In)).

As used herein, the dopant concentration in semiconductor material that is considered heavily doped may be at least an order of magnitude higher than the dopant concentration in semiconductor material that is considered lightly doped. The relative dopant concentrations for heavily-doped semiconductor material and lightly-doped semiconductor material are understood by a person having ordinary skill in the art. For example, a representative dopant concentration for heavily-doped semiconductor material may be greater than or equal to $10^{18}$ cm$^{-3}$, and a representative dopant concentration for lightly-doped semiconductor material may be less than or equal to $10^{16}$ cm$^{-3}$.

With reference to FIGS. 3, 3A, 3B, 3C in which like reference numerals refer to like features in FIGS. 2, 2A-C and at a subsequent fabrication stage, a mask feature 34 is formed on the top surface of device region 18 and a mask feature 35 is formed on the top surface of device region 20. The mask feature 34 covers a portion of well 28 and a portion of well 30 that remain after subsequent ion implantations in the process flow forming heavily-doped regions 38, 40, 44, 46. Mask feature 35 covers a portion of well 32 that remains after subsequent ion implantations in the process flow forming heavily-doped regions 42, 48.

The mask features 34, 35 may be comprised of a non-conductive dielectric material that is an electrical insulator and, in particular, may be comprised of a silicide blocking material, such as a nitride, oxide, or oxynitride of silicon deposited by CVD or PVD, that is used in a CMOS process to block silicide formation. The mask features 34, 35 may be patterned from a layer of the non-conductive dielectric material using photolithography and etching processes. To that end, the layer of the non-conductive dielectric material is deposited on the top surfaces 18a, 20a and a sacrificial layer is subsequently applied. The sacrificial layer may be comprised of a photoresist that is applied as a layer by a spin coating process, pre-baked, exposed to a radiation projected through a photomask, baked after exposure, and developed with a chemical developer to form an etch mask that includes a feature coinciding with the intended locations of mask features 34, 35. The feature is transferred from the sacrificial layer by the etching process to the layer to define the boundaries of the mask features 34, 35. The etching process may comprise a dry etching process, such as reactive-ion etching (RIE) that produces vertical sidewalls. The etching process, which may be conducted in a single etching step or multiple steps, relies on one or more etch chemistries and may comprise a timed etch or an end-pointed etch. The sacrificial layer is removed in response to forming the mask features 34, 35. If comprised of a photoresist, the sacrificial layer may be removed by ashing or solvent stripping, followed by surface cleaning.

Doped regions 38, 40 comprised of heavily-doped semiconductor material and doped regions 44, 46 comprised of heavily-doped semiconductor material of an opposite conductivity type are formed at selected locations in sections of the wells 28, 30. Doped regions 42 comprised of heavily-doped semiconductor material and doped regions 48 comprised of heavily-doped semiconductor material of an opposite conductivity type are formed at selected locations in sections of the well 32. The formation of the doped regions 38, 40, 42, 44, 46, 48 reduces the size of the wells 28, 30, 32. The mask features 34, 35 operate in conjunction with patterned sacrificial layers to self-align the selected locations for the doped regions 38, 40, 42, 44, 46, 48 and to cover the remaining sections of the wells 28, 30, 32 that survive intact in device regions 18, 20 after doped regions 38, 40, 42, 44, 46, 48 are formed.

The doped regions 38, 40, 42 may be formed by implanting ions of an impurity species into the device regions 18, 20 in the presence of a patterned sacrificial layer applied to the top surface of the device layer 12. The sacrificial layer controls dopant introduction into device regions 18, 20 during implantation by stopping the implanted ions within its thickness so that each of the device regions 18, 20 is selectively implanted with the impurity species. In particular, the sacrificial layer blocks the dopant from being implanted at the intended locations for doped regions 38, 40, 42. The mask features 34, 35 cooperate with the sacrificial layer to respectively prevent dopant introduction into the sections of the wells 28, 30, 32 that survive intact the formation of doped regions 38, 40, 42, 44, 46, 48. The sacrificial layer may be a resist layer having windows aligned with the intended location of the doped regions 38, 40 in device region 18 and the doped region 42 in the device region 20. The windows are formed in the sacrificial layer using a photolithographic patterning process. The implantation conditions (e.g., kinetic energy and dose) are selected to form the doped regions 38, 40, 42 with a desired doping concentration (e.g., heavy doping). After ion implantation is complete, the sacrificial layer is removed by, for example, oxygen plasma ashing or wet chemical stripping.

The doped regions 44, 46, 48 may be formed by implanting ions of an impurity species into the device regions 18, 20 in the presence of a patterned sacrificial layer applied to the top surface of the device layer 12. In the representative embodiment, the doped regions 44, 46, 48 are formed after the doped regions 38, 40, 42 are formed. The sacrificial layer controls dopant introduction into device regions 18, 20 during implantation by stopping the implanted ions within its thickness so that each of the device regions 18, 20 is selectively implanted with the impurity species. In particular, the sacrificial layer blocks the dopant from being implanted into doped regions 38, 40, 42. The mask features 34, 35 cooperate with the sacrificial layer to prevent dopant introduction into the sections of the wells 28, 30, 32 that survive intact following the formation of doped regions 38, 40, 42, 44, 46, 48. The sacrificial layer may be a resist layer having windows aligned with the intended location of the doped regions 44, 46 in device region 18 and the doped region 48 in the device region 20. The windows are formed in the sacrificial layer using a photolithographic patterning process. The implantation conditions (e.g., kinetic energy and dose) are selected to form the doped regions 44, 46, 48 with a desired doping concentration (e.g., heavy doping). After ion implantation is complete, the sacrificial layer is removed by, for example, oxygen plasma ashing or wet chemical stripping.

In a representative embodiment in which well 28 is a lightly-doped n-well and well 30 is a lightly-doped p-well, doped regions 38, 40 may be heavily doped to have p-type conductivity and doped regions 44, 46 may be heavily doped to have n-type conductivity. In a representative embodiment in which well 32 is a lightly-doped n-well, doped region 42 may be heavily doped to have p-type conductivity and doped region 48 may be heavily doped to have n-type conductivity. The ion implantation forming doped regions 38, 40, 42 introduces a dopant from Group V of the Periodic Table and ion implantation forming doped regions 44, 46, 48 introduces a dopant from Group III of the Periodic Table.

The resultant device structure includes a silicon controlled rectifier (SCR) 54 and a diode 56 in device region 18, and an additional diode 58 that is disposed in device region 20. The SCR 54 occupies section 24 of the device region 18 and the diode 56 occupies section 25 of the device region 18. The doped region 38 may represent an anode of the SCR 54, and the doped region 44 may represent a cathode of the SCR 54.

The SCR 54 and the diode 56 share the doped region 38 and the well 28 as device layers in their respective lateral constructions. The SCR 54 includes a plurality of p-n junctions 43, 45, 50 across each of which the conductivity type of the semiconductor material changes. A portion 26 of well 28 is butted with well 30 along an interface in section 24 of device region 18 to define the p-n junction 43. A portion 36 of doped region 38 and the portion 26 of well 28 are butted along an interface in section 24 of device region 18 to define the p-n junction 45. Doped region 44 is disposed in the well 30 and is comprised of semiconductor material having an opposite conductivity type from the lightly-doped semiconductor material of well 30. Doped region 44 and well 30 are butted along an interface that defines the p-n junction 50. Doped region 40 supplies a contact to the well 30.

The mask feature 34 overlies the wells 28, 30 and the p-n junction 43. Side walls 31, 33 of the mask feature 34 respectively define the locations of the p-n junctions 45, 50, as well as the interface between doped region 38 and well 28. The side wall 31 specifically defines the location of doped region 38 in well 28. Virtue of the location of the side wall 31 of the mask feature 34, doped region 38 and well 28, which are adjacent to each other and butted, extend across the entire length of the device region 18 and are present in both sections 24, 25 of device region 18. Another side wall 65 of the mask feature 34 defines the location of the doped region 44 within well 30 and the location of the interface between well 30 and doped region 44 that defines the p-n junction 50.

Doped regions 38, 44, and 40 are localized in section 24 of device region 18 along with well 30, and wells 28, 30 laterally separate doped region 38 from doped region 44 across the width, $W_1$, of the section 24 of device region 18. The distance between the anode (doped region 38) and the cathode (doped region 44) of the SCR 54 is defined by the width of the section of the mask feature 34 overlying the portion 26 of well 28 and the well 30.

The diode 56 includes a p-n junction 47 defined along an interface by the butting of a portion 37 of doped region 38 and a portion 27 of well 28. The p-n junction 47 of diode 56 is localized in section 25 of device region 18. The interface forming p-n junction 47 of diode 56 is continuous along the length, L, of the device region 18 with the interface forming the p-n junction 45 of SCR 54. Doped region 46 supplies a cathode of the diode 56 that is separated from the anode (doped region 42) by the portion 27 of well 28. The distance between the anode and cathode of the diode 56 is defined by the width of the overlying section of the mask feature 34, and may determine leakage, resistance, and reverse breakdown of the diode 56.

Figure 3:
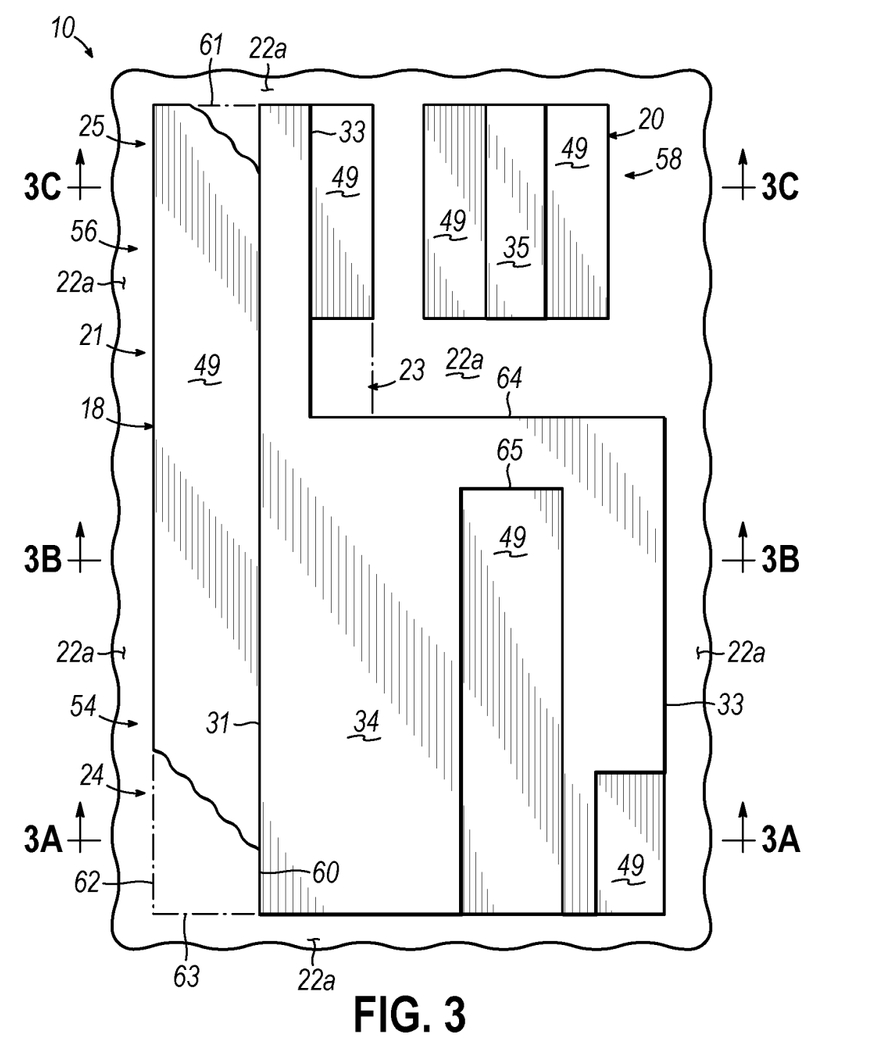
FIG. 3 is a top view of the substrate portion of FIG. 2 at a fabrication stage of the device structure subsequent to FIG. 2.
Figure 3A:
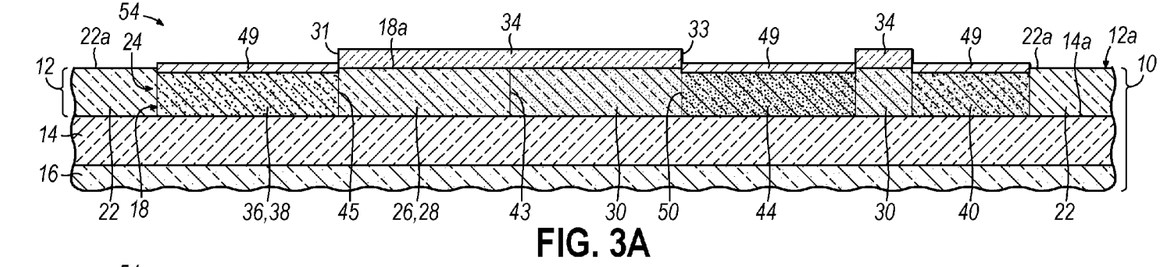
FIG. 3A is a cross-sectional view taken generally along line 3A-3A in FIG. 3.
Figure 3B:
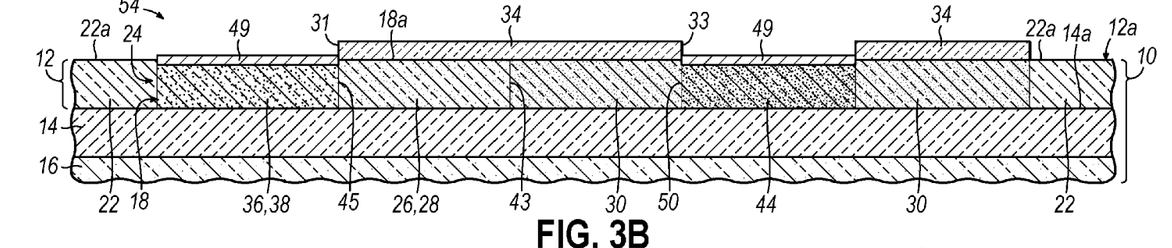
FIG. 3B is a cross-sectional view taken generally along line 3B-3B in FIG. 3.
Figure 3C:
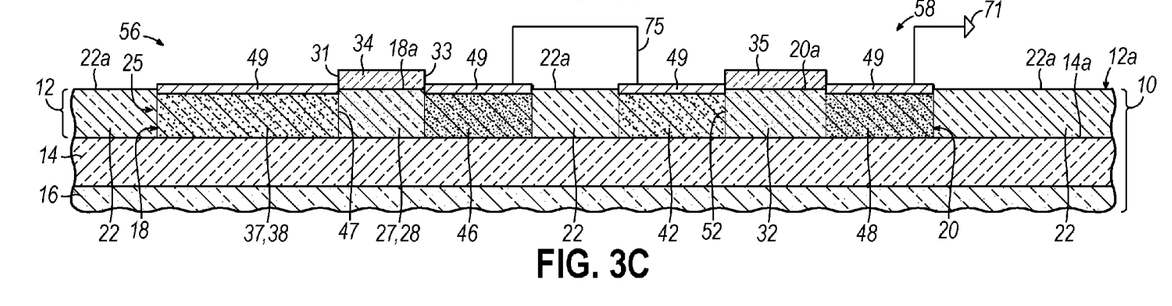
FIG. 3C is a cross-sectional view taken generally along line 3C-3C in FIG. 3.

As best shown in FIG. 3, doped region 46 is separated from the well 30 and the doped region 44 representing the cathode of the SCR 54 by at least one trench isolation region 23 from among the different trench isolation regions 22. The trench isolation region 23 interrupts the continuity of the sections 24, 25 of the device region 18 so that the trench isolation region 23 separates and electrically isolates the cathode (doped region 46) of the diode 56 from the cathode (doped region 44) and one gate (the well 30) of SCR 54.

Doped regions 42 and 48 of diode 58 are localized in device region 20 along with well 32. Doped region 42 of diode 58 is disposed in the well 32 and is comprised of semiconductor material having an opposite conductivity type from the lightly-doped semiconductor material of well 32. Doped region 42 and doped region 48 are disposed on opposite sides of well 32 so that doped region 42 is separated from doped region 48 by well 32. The well 32 and doped region 42 and are butted along an interface that defines a p-n junction 52. Doped region 48 supplies a contact to the well 32 and a cathode of the diode 58.

The doped region 38 serving as the anode for the SCR 54 and also as the anode for the diode 56 has a plurality of side walls 60, 61, 62, 63 that are joined and interconnected to surround the constituent heavily-doped semiconductor material. Side wall 60 of doped region 38 participates in forming the p-n junctions 45, 47 with the well 28 and is bound by the mask feature 34. The side wall 60 of doped region 38 is vertically aligned with the sidewalls 31 of the mask feature 34 and the interface between doped region 38 and well 28 that includes the p-n junctions 45, 47. The other side walls 61, 62, 63 are each bordered by one of the trench isolation regions 22 so that only side wall 60 participates in forming junctions 47, 45 with the lightly-doped well 28. In other words, the junction 47 for the diode 56 and one junction 45 for the SCR 54, and in particular the junctions with the anodes for the SCR 54 and diode 56, are formed along a common side wall 60. None of the side walls 61, 62, 63 are coextensive with lightly-doped semiconductor material, which reflects the absence of additional mask features overlying the side walls 61, 62, 63.

The well 28, which borders the full length of the doped region 38 and is oppositely doped from doped region 38, serves as a layer of the SCR 54 and as a cathode of the diode 56. The doped region 44 serves as a layer of the SCR 54 and, in particular, as a cathode of the SCR 54. The doped regions 38, 44 and the wells 28, 30 are mutually juxtaposed and have a parallel orientation in the device region 18. As a result, the SCR 54 and the diode 56 are laterally oriented from anode to cathode so as to have the same orientation.

Because the doped region 38 is bordered on side walls 61, 62, 63 by trench isolation material, capacitance loading is reduced for high frequency applications that require high speed operation. Specifically, the total anode capacitance of the device structure is given by the sum of a capacitance associated with p-n junction 45 of SCR 54 and a capacitance associated with p-n junction 47, which are formed with the use of mask feature 34. These represent the only capacitances for the anode of the SCR 54 represented by doped region 38. Because of the layout of the doped region 38 and well 28, all of the capacitances of the SCR 54 are used in the current-carrying path.

The length of the p-n junction 47 for diode 56 can be adjusted to select a trigger diode width. The capacitance associated with the p-n junction 47 determines at least in part the effectiveness of triggering the SCR 54. This adjustment to the trigger diode width can be made with flexibility and without altering the p-n junction 45 and the capacitance associated with the p-n junction 45. Because of the sharing of the device region 20 and the side-by-side arrangement of the SCR 54 and diode 56, a trigger current from the diode 56 is directly coupled with the SCR 54.

The diode 58 occupies device region 20 and is electrically isolated from the diode 56 and the SCR 54 by the trench isolation regions 22. Doped region 46 of diode 56, which represents the cathode of diode 56, is connected by a connection 75 (FIG. 3C) to doped region 42 of diode 58, which represents the cathode of diode 56, so that the diodes 56, 58 are interconnected in series to define a diode string 74 (FIG. 4) used to trigger the SCR 54. Additional diodes similar to diode 58 may be provided and interconnected in series with diodes 56, 58 to arbitrarily increase the number of diodes in the diode string 74.

The doped region 44 of the SCR 54 does not extend the full length of section 24 of device region 18 but instead has a terminal end that is coterminous with the side wall 65 of the mask feature 34. The terminal end of doped region 44 does not extend to a peripheral edge 64 of section 24, but instead a portion of the well 30 is located between the terminal end 65 of doped region 44 and the peripheral edge 64 of section 24. As a result, the well 30 is wrapped about a majority of the perimeter of the doped region 44. This at least partial wrapping about the perimeter of the doped region 44 may provide an enhanced body resistance, which may improve the triggering of the SCR 54. The doped region 40, which provides a body contact to well 30, may be reduced in size because of the enhancement in the body resistance.

A silicide layer 49 may be formed on regions of the top surface 18a of device region 18 and the top surface 20a of device region 20 that are not respectively covered by the mask features 34, 35. A silicidation process may be employed to form the silicide layer 49 that involves one or more annealing steps to form a silicide phase from the layer of silicide-forming metal and the material of the device regions 18, 20.

Standard processing follows the formation of the device structure to provide contacts to the SCR 54 and diodes 56, 58, and to also furnish a back-end-of-line (BEOL) interconnect structure. The SCR 54 may be used as a protection element in an electrostatic discharge (ESD) protection circuit configured to discharge current from an ESD pulse to ground and the diodes 56, 58 may be used to trigger the SCR 54 in response to the ESD pulse.

Figure 4:
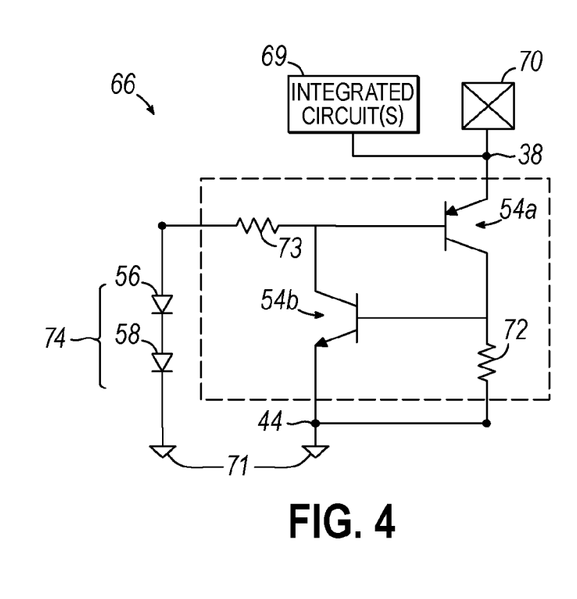
FIG. 4 is a schematic view of an electrical configuration for the device structure of FIGS. 3, 3A, 3B, 3C.
Figure 5:
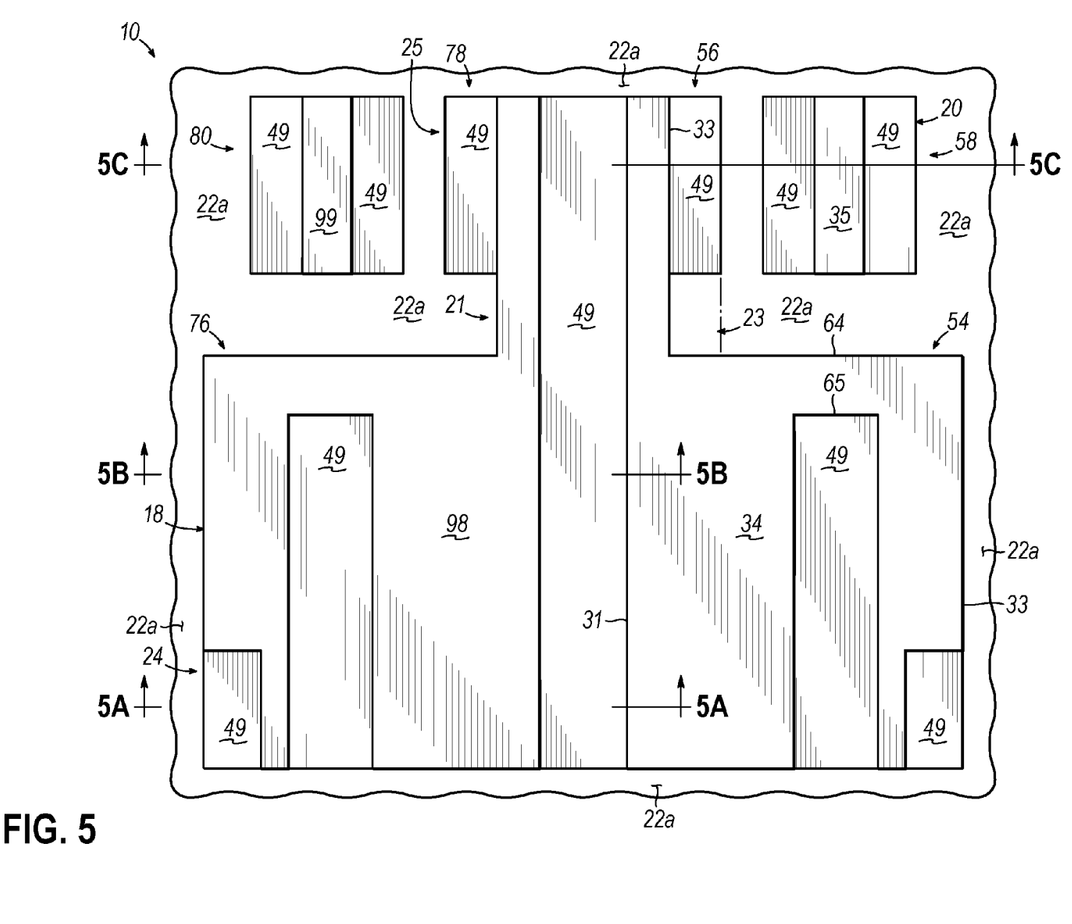
FIG. 5 is a top view of a device structure in accordance with an alternative embodiment of the invention.
Figure 5A:
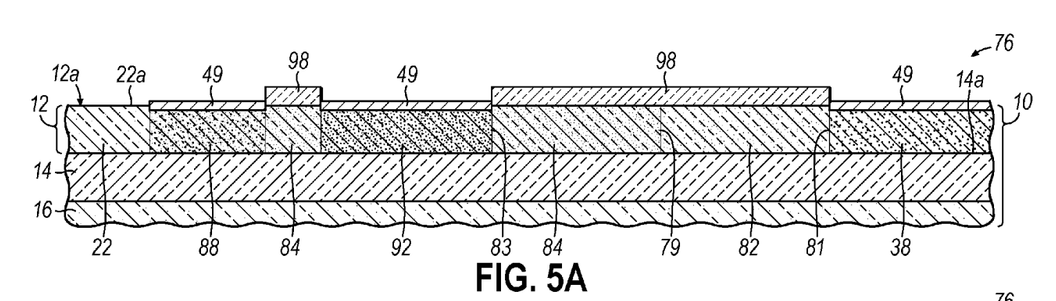
FIG. 5A is a cross-sectional view taken generally along line 5A-5A in FIG. 5.
Figure 5B:
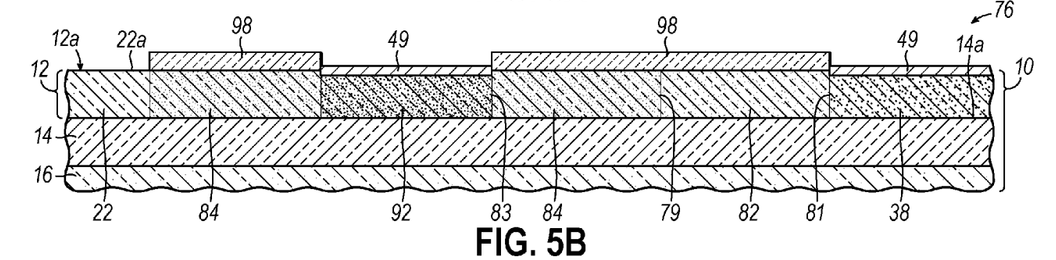
FIG. 5B is a cross-sectional view taken generally along line 5B-5B in FIG. 5.
Figure 5C:
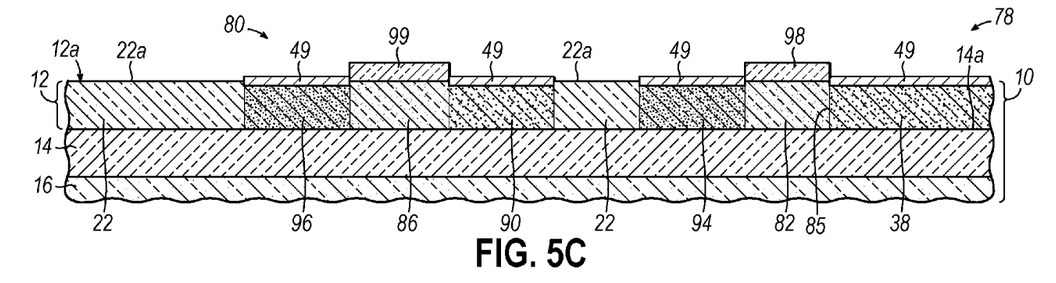
FIG. 5C is a cross-sectional view taken generally along line 5C-5C in FIG. 5.

With reference to FIG. 4 in which like reference numerals refer to like features in FIGS. 3, 3A-C, an ESD protection circuit 66 may include the device structure comprised of SCR 54 and diodes 56, 58. The SCR 54 is comprised of cross-coupled parasitic PNP and NPN bipolar transistors 54a, 54b. The SCR 54 and one or more protected integrated circuits 69 may be electrically coupled by a common signal path to an input/output (I/O) pad 70. More specifically, the doped region 38 (i.e., the anode of the SCR 54) may be coupled with the I/O pad 70 and the protected integrated circuits 69 and the doped region 44 (i.e., the cathode of the SCR 54) may be coupled to the ground buss at a ground pad 71. In addition, the coupling of the doped region 38 with the I/O pad 70 and the protected integrated circuits 69 also couples the I/O pad 70 and the protected integrated circuits 69 with the anode of the diode 56.

Doped region 48 of diode 58 is coupled to the ground bus at ground pad 71. The ground pad 71 is grounded even when the protected integrated circuits 69 are not powered. Wells 28, 30 define electrical resistances 72, 73 in the ESD protection circuit 66. When the protected integrated circuits 69 are powered, the SCR 54 will present a high impedance between the I/O pad 70 and the ground buss at ground pad 71 so that signals communicated over the signal path between the I/O pad 70 and the integrated circuits 69 are substantially unaffected by the presence of the SCR 54.

The gate of the PNP bipolar transistor 54a is coupled with the diodes 56, 58 of the diode string 74. The diode string 74 of the ESD protection circuit 66 is configured to respond to the voltage from an ESD pulse by triggering the SCR 54 to enter a low-impedance conducting state. In this state, a current-carrying path for the ESD current is defined through the SCR 54 from the I/O pad 70 to the ground pad 71. The current-carrying path includes the doped regions 38, 44 and the portions of wells 28, 30 between doped regions 38, 44. When triggered, the SCR 54 is induced to enter the low-impedance conducting state and thereby divert the ESD pulse through the current-carrying path and away from the protected integrated circuits 69. In response to the ESD current flowing through the SCR 54, the bipolar transistors 54a, 54b hold each other in the low-impedance conducting state and the low impedance conductive state persists. At the conclusion of the ESD event, the SCR 54 reverts to the high-impedance non-conducting state and remains off until a trigger signal is applied in response to a future ESD pulse.

With reference to FIGS. 5, 5A, 5B, 5C in which like reference numerals refer to like features in FIGS. 3, 3A-C and in accordance with an alternative embodiment, the device structure may be modified to add another SCR 76 and diodes 78, 80 to the SCR 54 and diodes 56, 58. The modified device structure supplies a dual-directional silicon control rectifier device structure that may be used, for example, for ESD current discharge in an ESD protection circuit with SCR 54 and SCR 76 wired in parallel by the interconnect structure.

The SCR 76 shares the doped region 38 in common with SCR 54 so that the anode is likewise shared between the SCR 54 and the SCR 76. The SCR 76 includes wells 82, 84, 86 analogous to wells 28, 30, 32, doped regions 88, 90, 92, 94, 96 analogous to doped regions 40, 42, 44, 46, 48, and mask features 98, 99 analogous to mask features 34, 35, which are structurally arranged to mirror the structural arrangement of SCR 54. The SCR 76 includes p-n junctions 79, 81, 83 analogous to the p-n junctions 43, 45, 50 of SCR 54, and diode 78 includes a p-n junction 85 analogous to p-n junction 47 of diode 56.

The mask feature 98 overlies the wells 82, 84 and the p-n junction 79. The side walls of the mask feature 98 define the locations of the p-n junctions 81, 83. Virtue of the location of the side walls of the mask feature 98, the well 82 is aligned along the length of the device region 20 with the doped region 38 so that the doped region 38 is positioned between the wells 28, 82, well 28 is coextensive with side wall 60 of doped region 38, and well 82 is coextensive with side wall 62 of doped region 38. Doped region 38 and well 82, which are adjacent to each other and butted similar to doped region 38 and well 28, extend across the entire length, L, of the device region 18 and are present in both of the sections 24, 25 of device region 18.

In the representative embodiment, the respective widths of the sections 21, 24, 25 of device region 20 are increased by a factor of two less the width of the doped region 38. This reflects the reflection symmetry of the SCR 76 and the SCR 54 along an axis of symmetry coincident with a centerline of the shared doped region 38 extending over the length of device region 18. However, one or more of the individual widths of the wells 82, 84 and doped region 92 may differ from the widths of wells, 28, 30 and doped region 44 so that the mirror symmetry is lost. The diode 80 resides in an island device region proximate to diode 78 analogous to device region 20, and is wired in series with diode 78.

The sharing of the anode manifested by the sharing of doped region 38 increases the failure current per anode area of the modified structure. While the connection of the doped region 38 to the I/O pad 70 (FIG. 4) is the same in the ESD protection circuit 66, both of the cathodes (doped regions 44, 92) are shorted together and coupled with the ground buss at ground pad 71.

Figure 6:
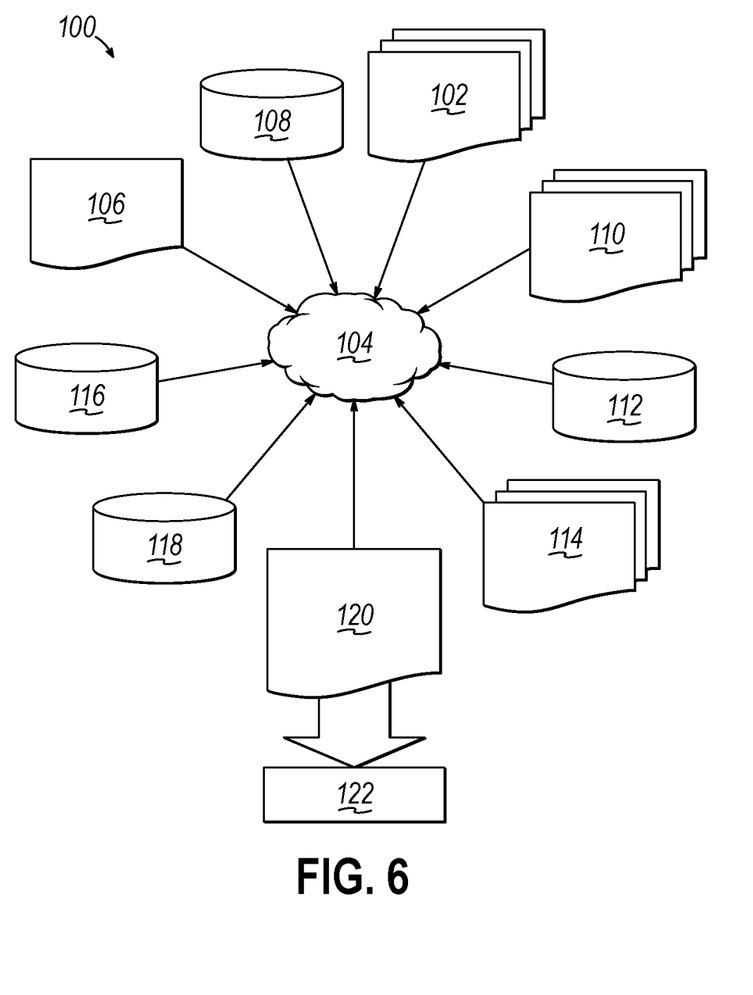
FIG. 6 is a flow diagram of a design process used in semiconductor design, manufacture, and/or test.

FIG. 6 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 3, 3A-C and FIGS. 5, 5A-C. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 3, 3A-C and FIGS. 5, 5A-C. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 3, 3A-C and FIGS. 5, 5A-C to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3, 3A-C and FIGS. 5, 5A-C. In one embodiment, design structure 120 may comprise a compiled, executable HDL simulation model that functionally simulates the devices shown in FIGS. 3, 3A-C and FIGS. 5, 5A-C.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3, 3A-C and FIGS. 5, 5A-C. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure, the method comprising:
   forming a first well of a first conductivity type in a first device region;
   forming a first doped region of a second conductivity type in the first well;
   forming a cathode of a first silicon controlled rectifier in the first device region; and
   forming a cathode of a first diode in the first device region, wherein the first silicon controlled rectifier comprises a first portion of the first well and an anode comprised of a first portion of the first doped region, and the first diode comprises a second portion of the first well and an anode comprised of a second portion of the first doped region.

2. The method of claim 1 further comprising:
   forming a plurality of trench isolation regions that define the first device region from a first portion of a device layer of a semiconductor-on-insulator substrate,
   wherein the shallow trench isolation regions extend from a top surface of the device layer to a buried insulator layer of the semiconductor-on-insulator substrate.

3. The method of claim 2 further comprising:
   forming a second device region from a second portion of the device layer of the semiconductor-on-insulator substrate,
   wherein at least one of the shallow trench isolation regions isolates the second device region from the first device region.

4. The method of claim 3 further comprising:
   forming a second diode in the second device region; and
   connecting an anode of the second diode in series with the cathode of the first diode.

5. The method of claim 2 wherein at least one of the shallow trench isolation regions is between the cathode of the first silicon controlled rectifier and the cathode of the first diode.

6. The method of claim 5 further comprising:
   forming a second well of the second conductivity type in the first device region; and
   forming a second doped region of the first conductivity type in the second well to define the cathode of the first silicon controlled rectifier,
   wherein the second well is disposed between the first well and the cathode of the first silicon controlled rectifier, and the second well is disposed between the first well and the first doped region.

7. The method of claim 1 wherein the first doped region and the first well are oriented with a parallel alignment within the first device region, and the first doped region intersects the first well along an interface including a junction for the first silicon controlled rectifier and a junction for the first diode.

8. The method of claim 7 further comprising:
   forming trench isolation regions about a portion of a perimeter of the first doped region that does not intersect with the first well along the interface.

9. The method of claim 7 further comprising:
   forming a mask feature on a top surface of the first device region that overlies the first well and that has a sidewall defining an edge aligned with the interface.

10. The method of claim 1 further comprising:
    forming a second silicon controlled rectifier in the first device region that comprises the anode of the first silicon controller rectifier in a shared configuration; and
    coupling the second silicon controlled rectifier in parallel with the first silicon controlled rectifier.

11. The method of claim 1 wherein the first silicon controlled rectifier comprises a second well of the second conductivity type and a second doped region of the first conductivity type in the second well, and the second well wraps at least partially about the second doped region to define a resistor.

* * * * *